United States Patent [19]

Kanai

[11] Patent Number: 4,530,002
[45] Date of Patent: Jul. 16, 1985

[54] CONNECTION LEAD ARRANGEMENT FOR A SEMICONDUCTOR DEVICE

[75] Inventor: Yasunori Kanai, Inagi, Japan

[73] Assignee: Fujitsu Ltd., Kawasaki, Japan

[21] Appl. No.: 391,161

[22] Filed: Jun. 22, 1982

[51] Int. Cl.³ .................. H01L 23/48; H01L 23/50
[52] U.S. Cl. ........................... 357/68; 357/75; 357/70
[58] Field of Search ............ 357/71, 70, 68, 74; 174/68.5

[56] References Cited

U.S. PATENT DOCUMENTS

| 4,142,203 | 2/1979 | Dietz | 357/80 |
| 4,150,421 | 4/1979 | Nishihara et al. | 174/68.5 X |
| 4,245,273 | 1/1981 | Feinberg et al. | 357/82 X |
| 4,296,456 | 10/1981 | Reid | 361/403 |
| 4,322,778 | 3/1982 | Barbour et al. | 174/68.5 X |

FOREIGN PATENT DOCUMENTS 2736055 2/1978 Fed. Rep. of Germany .
2282719 3/1976 France .

OTHER PUBLICATIONS

"Personalized Prepackaged Semiconductor Devices" Chang et al.—IBM Technical Disclosure Bulletin, vol. 17, No. 7, Dec. 1974, p. 1950.
"Heat Dissipation from IC Chips through Module Package" Balderes et al., IBM Technical Disclosure Bulletin, vol. 19, No. 11, Apr. 1977, p. 4165.
"Microcircuit Having Pinned Terminals"—Cochran et al.—IBM Disclosure Bulletin, vol. 8, No. 11, Apr. 1966, pp. 1483–1484.

Primary Examiner—Andrew J. James
Assistant Examiner—Sheila V. Clark
Attorney, Agent, or Firm—Staas & Halsey

[57] ABSTRACT

A semiconductor device having improved construction of connection leads extending from the chip carrier housing for connecting a semiconductor chip in the housing with the external circuitry. The connection leads are arranged in the form of a plurality of concentric arrays. The leads in the outermost array are composed of surface connection leads to be electrically connected to the uppermost layer of a multilayer printed board to which the semiconductor device will be mounted, and the leads in the inner array or arrays are composed of lead pins to be inserted into and be electrically connected to the through holes of the multilayer printed board.

9 Claims, 15 Drawing Figures

CONNECTION LEAD ARRANGEMENT FOR A SEMICONDUCTOR DEVICE

BACKGROUND OF THE INVENTION

The present invention relates to a semiconductor device having an improved construction of connection leads which extend from a chip carrier housing to connect a semiconductor chip in the housing with the external circuitry.

Semiconductor devices utilize two main types of chip carrier housings for packaging integrated-circuit (IC), large-scale integration (LSI), and other semiconductor chips having a large number of connection leads. One is a "flat" type housing having flat-formed leads. The other is a "plug-in" type housing having lead pins. Both of these types of housings are disadvantageous in that the greater the number of the connection leads necessary, the much larger the resultant package size.

SUMMARY OF THE INVENTION

It is, therefore, an object of the present invention to provide a semiconductor device which can be made small even when a large number of connection leads are used.

A semiconductor device in accordance with the present invention comprises: at least one semiconductor chip; a chip carrier housing for packaging the semiconductor chip; and a plurality of connection leads each of which is electrically connected to the semiconductor chip and each of which projects from the outer surface of the chip carrier housing. The projected connection leads are arranged in the form of a plurality of concentric arrays, with the projected connection leads in the outermost array being composed of surface connection leads to be connected to the uppermost layer of a multilayer printed board to which the semiconductor device will be mounted, and the projected connection leads in the inner array or arrays being composed of lead pins to be inserted into and be electrically connected to the through holes of the multilayer printed board.

The above and other related objects and features of the present invention will be apparent from the description of the present invention set forth below, with reference to the accompanying drawings, as well as from the appended claims.

BRIEF DESCRIPTION OF THE DRAWINGS

FIG. 2b is a bottom plane view of FIG. 2a;

DETAILED DESCRIPTION OF THE PREFERRED EMBODIMENTS

Before describing the preferred embodiments of the present invention, the constitution of the conventional semiconductor devices and problems existing therein will be explained in detail with reference to FIGS. 1, 2a and 2b.

Figure 1:
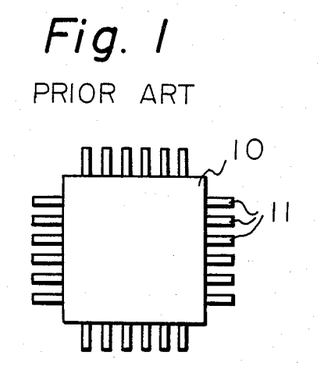
FIG. 1 is a bottom plane view illustrating a flat type housing of the prior art.

As shown in FIG. 1, the flat-type housing semiconductor device has a chip carrier housing 10 packaging an IC, LSI, or other semiconductor chip and has flat leads 11 for electrically connecting the packaged semiconductor chip with the external circuitry. The flat leads are extended outward from the side or along the bottom of the housing 10, both parallel to the bottom of the housing 10. As is apparent from the drawing, the leads 11 of the flat-type housing semiconductor device are arranged in the form of one array around the housing 10.

Furthermore, the distance between the flat leads 11 cannot be shorter than the conductor pitch of the printed wiring board on which the semiconductor device is to be mounted. Therefore, the greater the number of leads necessary, the larger the size of the housing and, therefore, the smaller the mounting density of the semiconductor device on the printed wiring board. This increases not only the direct-current resistance and self-inductance of the leads of the semiconductor device, but also the electrostatic capacity and mutual-inductance between leads, causing the electric characteristics of the semiconductor device to deteriorate.

Figure 2A:
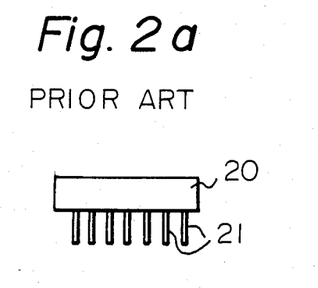
FIG. 2a is a side view illustrating a plug-in type housing of the prior art.
Figure 2B:
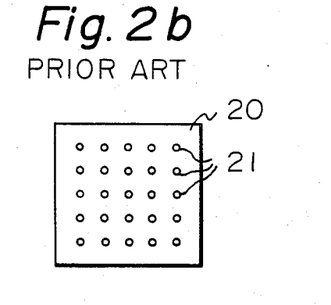

As shown in FIGS. 2a and 2b, the plug-in type housing semiconductor device has a chip carrier housing 20 packaging a semiconductor chip and has lead pins 21 extending downward from the bottom of the housing 20, for electrically connecting the packaged semiconductor chip with the external circuitry.

Since, as shown in these drawings, the plug-in type housing semiconductor device in which a highly integrated semiconductor chip is packaged has the lead pins 21 arranged in a plurality of concentric arrays, the printed wiring board mounting such plug-in type housing semiconductor devices must have a corresponding number of conductive layers. The greater the number of concentric arrays of the lead pins 21, the greater the number of the layers. The greater the number of the layers required, the much greater the manufacturing cost of the multilayer printed wiring board.

Furthermore, the distance between the lead pins arranged in the outer array cannot be small. This is because, in the multilayer printed wiring board, the conductive line for connecting the external circuitry with the through holes into which the inner lead pins of the semiconductor device will be inserted must run between the through holes into which the outer lead pins of the semiconductor device will be inserted. The pitch between the outermost arranged similar to pins of the plug-in type housing semiconductor device cannot be less than the minimum distance between the through holes of the printed wiring board, and, as mentioned above, said through holes have to be at least one conductor line diameter distance apart from each other. Therefore, as with the flat-type housing device, the greater the number of the lead pins 21 necessary, the larger the size of the housing 20. This again reduces the mounting density of the plug-in type housing semiconductor device on the printed wiring board and causes the electrical characteristics thereof to deteriorate.

Hereinafter, preferred embodiments of the present invention will be explained in detail.

Figure 3A:
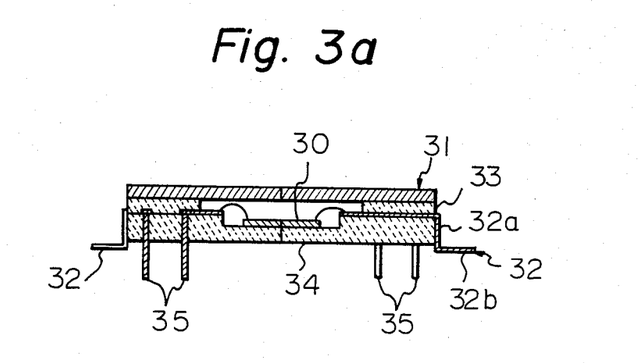
FIG. 3a is a III—III' sectional view of FIG. 3b.
Figure 3B:
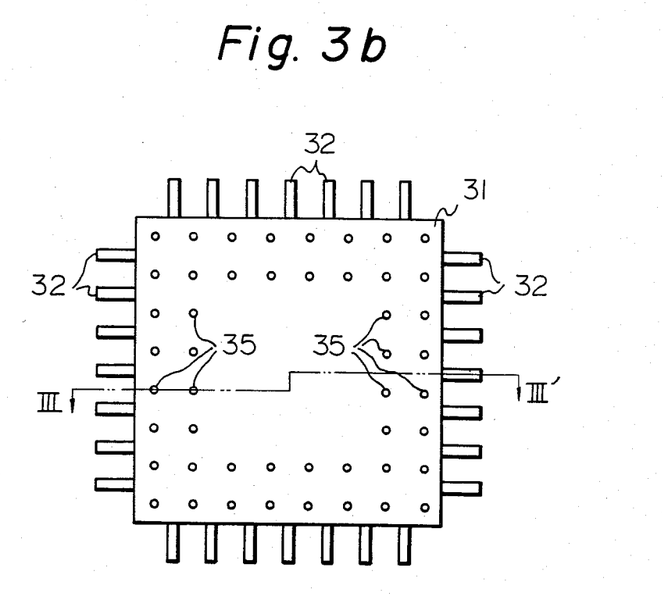
FIG. 3b is a bottom plane view illustrating a first embodiment of the present invention.

Referring to FIGS. 3a and 3b, which illustrate a first embodiment of the present invention, reference numeral 30 denotes a semiconductor chip on which an IC or LSI circuit is formed. Reference numeral 31 denotes a chip carrier housing for packaging the semiconductor chip 30. A plurality of connection leads used for electrically connecting the semiconductor chip 30 with external circuitry are arranged in the form of three concentric arrays. The connection leads in the outermost array are composed of surface connection leads 32 made of bands or strips of metal similar to the flat leads of the conventional flat-type housing semiconductor device. According to the first embodiment of FIGS. 3a and 3b, each of the surface connection leads 32 is a bent strip or band of metal, which comprises a first portion 32a projecting from the side 33 of the housing 31 and extending downward along the side 33, and a second portion 32b extending outward from the end of the first portion 32a in a direction perpendicular to lead pins 35. Each of the first portions 32a of the surface connection leads 32 is close to the side 33 of the housing 31. The connection leads arranged in the inner two arrays are composed of the lead pins 35 made of metal pins. These lead pins 35 extend downward from the bottom 34 of the chip carrier housing 31 similar to the lead pins of the conventional plug-in type housing semiconductor device. In these lead pins 35, some pins near the semiconductor chip 30 are used as power leads for supplying power to the chip 30 in order to prevent the voltage drop of the power. Other lead pins are used for signal leads.

Figure 4A:
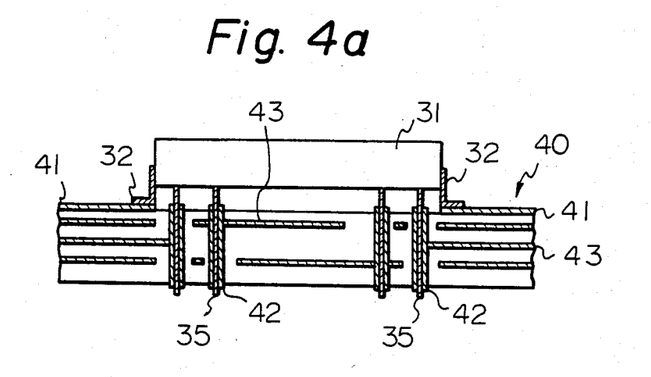
FIG. 4a is a IV—IV' sectional view of FIG. 4b.
Figure 4B:
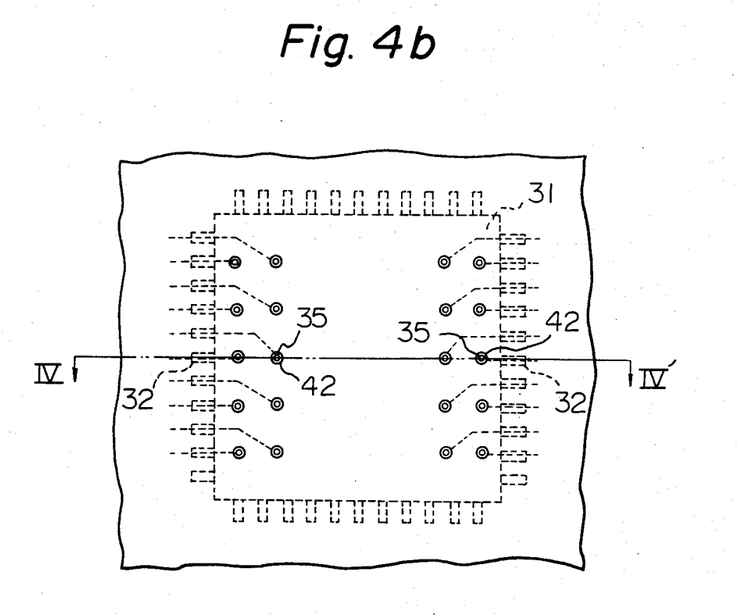
FIG. 4b is a bottom plane view illustrating a part of a printed wiring board on which the semiconductor device according to the first embodiment of FIGS. 3a and 3b is mounted.

As shown in FIGS. 4a and 4b, such a semiconductor device of FIGS. 3a and 3b is mounted on a multilayer printed wiring board 40 by joining the surface connection leads 32 to the uppermost conductor layer 41 of the printed wiring board 40 and by joining the lead pins 35 to the through holes 42, by means of soldered connections. Namely, the surface connection leads 32 arranged in the outermost array of the housing 31 are electrically connected to the uppermost conductor layer 41 of the printed wiring board 40, and the lead pins 35 arranged in the inner arrays of the housing 31 are electrically connected to the other conductor layers (inner conductor layers) 43 via the through holes 42. With respect to the surface connection leads 32 in the outermost array of the housing 31, no through hole is necessary for the electrical connection. Therefore, if the semiconductor device according to the present invention is utilized, the printed wiring board on which the semiconductor device is mounted can omit the through holes corresponding to the outermost connection leads of the semiconductor device. As a result, the signal lines in the printed wiring board, which signal lines are connected to the inner connection leads of the semiconductor device, can be removed relatively freely from the area where the device is mounted, by using the conductive layers different from the uppermost layer, irrespective of the lead-to-lead pitch of the outermost connection leads of the semiconductor device.

Therefore, the lead-to-lead pitch of the outermost connection leads of the semiconductor device can be shortened to the minimum extent allowed by the manufacture of the printed board and the chip carrier housing. Thus, the size of the housing can be decreased in comparison with conventional chip carrier housing. Furthermore, the mounting density of the semiconductor device on the printed wiring board is improved, lowering the cost of the printed wiring board per semiconductor chip. The greater freedom for removing the signal lines connected to the inner connection leads of the mounted semiconductor device enables the reduction of the number of the layers of the printed wiring board. The smaller size of the housing enables the improvement of the electrical characteristics of the semiconductor device, such as the direct-current resistance and self-inductance of the connection lead and the capacitance and mutual inductance between the connection leads.

Furthermore, according to the present invention, since many power leads can be provided at the position near the semiconductor chip, the power voltage drop at the connection leads can be reduced.

Figure 5:
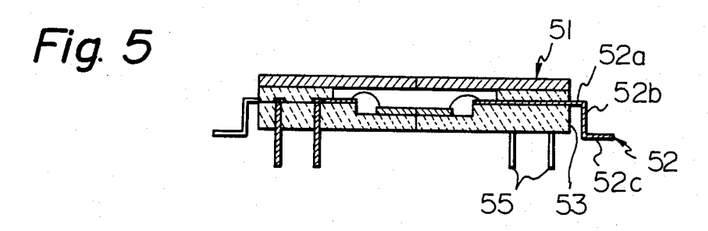
FIG. 5 is a sectional side view illustrating a second embodiment of the present invention.

FIG. 5 illustrates a second embodiment of the present invention. According to this embodiment, each of the surface connection leads 52 is a bent strip or band of metal which comprises a first portion 52a projecting from the side surface 53 of the chip carrier housing 51 and extending outwardly, a second portion 52b extending downward from the end of the first portion 52a along the side 53, and a third portion 52c extending outward from the end of the second portion 52b in a direction perpendicular to the direction of lead pins 55. Each of the second portions 52b of the surface connection leads 52 is spaced from the side 53 of the housing 51. Other features of the second embodiment of FIG. 5 are the same as the first embodiment of FIGS. 3a and 3b.

Figure 6:
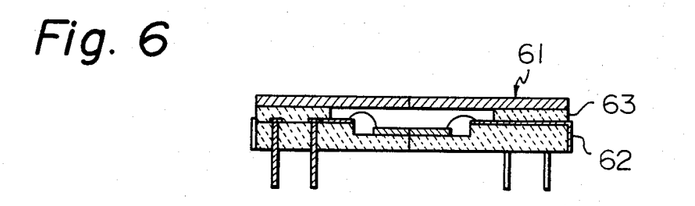
FIG. 6 is a sectional side view illustrating a third embodiment of the present invention.

FIG. 6 illustrates a third embodiment of the present invention. According to this embodiment, each of the surface connection leads 62 is composed of a strip or band of metal projecting from the side 63 of the chip carrier housing 61 and extending downward from the projected position along the side 63. Each of the leads 62 is close to the side 63 of the housing 61. Other features of the third embodiment of FIG. 6 are the same as the first embodiment of FIGS. 3a and 3b.

Figure 7:
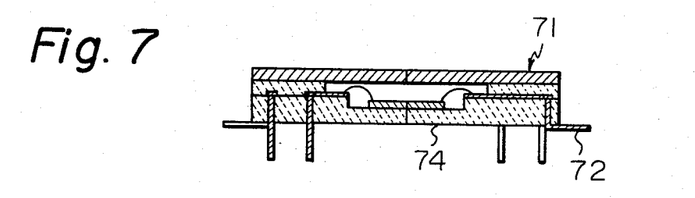
FIG. 7 is a sectional side view illustrating a fourth embodiment of the present invention.

FIG. 7 illustrates a fourth embodiment of the present invention. According to this embodiment, each of the surface connection leads 72 is composed of a strip or band of metal projecting from the bottom 74 of the chip carrier housing 71 and extending outward from the projected position in parallel with the bottom 74 of the housing 71. Other features of the fourth embodiment of FIG. 7 are the same as the first embodiment of FIGS. 3a and 3b.

Figure 8:
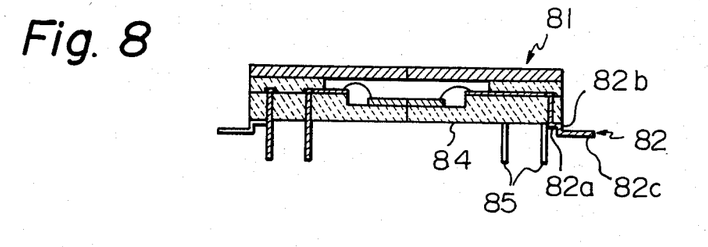
FIG. 8 is a sectional side view illustrating a fifth embodiment of the present invention.

FIG. 8 illustrates a fifth embodiment of the present invention. According to this embodiment, each of the surface connection leads 82 is a bent strip or band of metal which comprises a first portion 82a projecting from the bottom 84 of the chip carrier housing 81 and extending outwardly along the bottom 84, a second portion 82b extending downward from the end of the first portion 82a, and a third portion 82c extending outward from the end of the second portion 82b in a direction perpendicular to the direction of the lead pins 85. Other features of the fifth embodiment of FIG. 8 are the same as the first embodiment of FIGS. 3a and 3b.

Figure 9A:
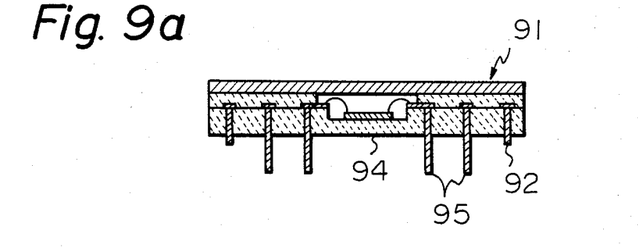
FIG. 9a is a IX—IX' sectional view of FIG. 9b.
Figure 9B:
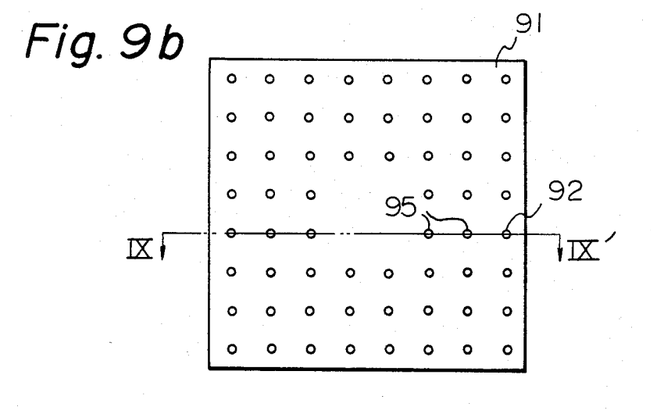
FIG. 9b is a bottom plane view illustrating a sixth embodiment of the present invention.
Figure 10:
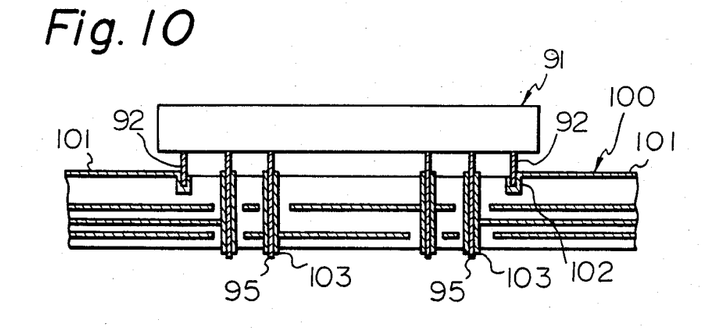
FIG. 10 is a sectional side view illustrating a part of a printed wiring board on which the semiconductor device according to the sixth embodiment of FIGS. 9a and 9b is mounted.
Figure 11:
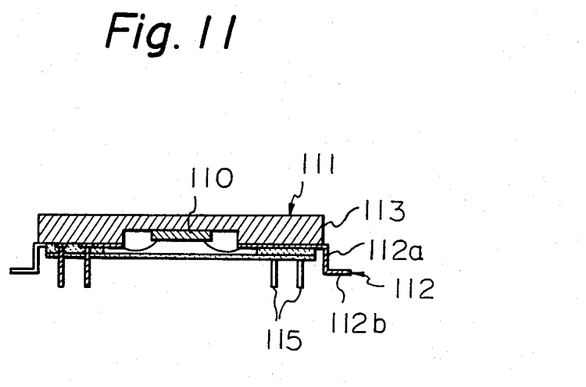
FIG. 11 is a sectional side view illustrating a seventh embodiment of the present invention.

FIGS. 9a and 9b illustrate a sixth embodiment of the present invention. According to this embodiment, the connection leads in the outermost array are composed of lead pins 92 made of metal pins, extending downward from the bottom 94 of the chip carrier housing 91 as well as the connection leads in the inner two arrays. However, the lead pins 92 arranged in the outermost array are made shorter than the lead pins 95 in the inner arrays. As shown in FIG. 10, the semiconductor device of the sixth embodiment of FIGS. 9a and 9b is mounted on a multilayer printed wiring board 100 by joining the shorter lead pins 92 to recesses 101 of the uppermost conductor layer 102 of the printed wiring board 100 and by joining the lead pins 95 to the through holes 103, by means of soldered connections. Other features of the sixth embodiment of FIGS. 9a and 9b are the same as the first embodiment of FIGS. 3a and 3b;

FIG. 11 illustrates a seventh embodiment of the present invention. According to this embodiment, a semiconductor chip 110 on which an IC or LSI circuit is formed is packaged face down in a chip carrier housing 111. Each of surface connection leads 112 is a bent strip or band of metal, which comprises a first portion 112a projecting from the side 113 of the housing 111 end extending downward, and a second portion 112b extending outward from the end of the first portion 112a in a direction perpendicular to lead pins 115. Other features of the seventh embodiment of FIG. 11 are the same as the first embodiment of FIGS. 3a and 3b.

The functions and effects of the above-mentioned second to seventh embodiments are substantially the same as these of the first embodiment.

Since many widely different embodiments of the present invention may be constructed without departing from the spirit and scope of the present invention, it should be understood that the present invention is not limited to the specific embodiments described in this specification, except as defined in the appended claims.

I claim:

1. A semiconductor device to be mounted on a multilayer printed board having through holes which connect to an inner conductive layer and an uppermost layer, said device comprising:
   at least one semiconductor chip;
   a chip carrier housing for packaging said at least one semiconductor chip; and
   a plurality of connection leads electrically connected to said semiconductor chip and projected outward from the outer surface of said chip carrier housing, said connection leads being arranged in the form of a plurality of concentric arrays, said connection leads in the outermost array being connected to the uppermost layer of the multilayer printed board, and said connection leads in the inner array or arrays being composed of lead pins to be inserted into and be electrically connected to the through holes of the multilayer printed board which are connected to the inner conductive layer.

2. A semiconductor device as claimed in claim 1, wherein said chip carrier housing has a side and said connection leads arranged in the outermost array are projected outward from a position on the side of said chip carrier housing.

3. A semiconductor device as claimed in claim 2, wherein each of said connection leads arranged in the outermost array comprises:
   a first portion which extends downward from the projected position along the side of the chip carrier housing, said first portion abutting said side; and
   a second portion which extends outward from the end of the first portion in a direction perpendicular to said lead pins.

4. A semiconductor devie as claimed in claim 2, wherein each of said connection leads arranged in the outermost array comprises:
   a first portion which projects and extends outward from the projected position on the side of the chip carrier housing;
   a second portion which extends downward from the end of the first portion along the side of the chip carrier housing, said second portion being spaced from said side; and
   a third portion which extends outward from the end of the second portion in a direction perpendicular to said lead pins.

5. A semiconductor device as claimed in claim 2, wherein each of said connection leads arranged in the outermost array is composed of a member which extends downward from the projected position along the side of the chip carrier housing, said member abutting said side.

6. A semiconductor device as claimed in claim 1, wherein said chip carrier housing further comprises a bottom and said connection leads arranged in the outermost array are projected outward from a position on the bottom of said chip carrier housing.

7. A semiconductor device as claimed in claim 6, wherein each of said connection leads arranged in the outermost array is composed of a member which extends outward from the projected position in parallel with the bottom of the chip carrier housing.

8. A semiconductor device as claimed in claim 6, wherein each of said connection leads arranged in the outermost array comprises:
   a first portion which extends outward from the projected position along said bottom;
   a second portion which extends downward from the end of the first portion; and
   a third portion which extends outward from the end of the second portion in a direction perpendicular to said lead pins.

9. A semiconductor device as claimed in claim 6, wherein each of said connection leads arranged in the outermost array is composed of a lead pin which is shorter than the lead pins arranged in the inner array.

* * * * *

UNITED STATES PATENT AND TRADEMARK OFFICE
CERTIFICATE OF CORRECTION

PATENT NO. : 4,530,002
DATED : Jul. 16, 1985
INVENTOR(S) : Kanai

It is certified that error appears in the above-identified patent and that said Letters Patent is hereby corrected as shown below:

Front Page

Insert --[30] Foreign Application Priority Data
      Jun. 26, 1981 [JP] Japan...........56-100337--.

Col. 2
Line 68, delete "similar to" and insert --lead--.

Col. 6
Line 17, "devie" s/b --device--.

Signed and Sealed this

Twenty-second Day of October 1985

[SEAL]

Attest:

DONALD J. QUIGG

Attesting Officer

Commissioner of Patents and
Trademarks—Designate